United States Patent
Lu

(10) Patent No.: US 11,081,504 B2
(45) Date of Patent: Aug. 3, 2021

(54) DISPLAY DEVICE

(71) Applicant: WUHAN CHINA STAR OPTOELECTRONICS TECHNOLOGY CO., LTD., Hubei (CN)

(72) Inventor: Yantao Lu, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 88 days.

(21) Appl. No.: 16/467,996

(22) PCT Filed: Jan. 24, 2019

(86) PCT No.: PCT/CN2019/072885
§ 371 (c)(1),
(2) Date: Jun. 10, 2019

(87) PCT Pub. No.: WO2020/113802
PCT Pub. Date: Jun. 11, 2020

(65) Prior Publication Data
US 2020/0243572 A1 Jul. 30, 2020

(30) Foreign Application Priority Data
Dec. 7, 2018 (CN) .......................... 201811495328.X

(51) Int. Cl.
*H01L 27/12* (2006.01)
*G02F 1/1345* (2006.01)
(Continued)

(52) U.S. Cl.
CPC ...... *H01L 27/1244* (2013.01); *G02F 1/13452* (2013.01); *G02F 1/133345* (2013.01);
(Continued)

(58) Field of Classification Search
CPC ................. H01L 27/1244; H01L 23/60; H01L 29/78633; G02F 1/13452; G02F 1/136204; G02F 1/136286
(Continued)

(56) References Cited

U.S. PATENT DOCUMENTS

2018/0166467 A1* 6/2018 Lai et al. .............. H01L 27/124
257/72

OTHER PUBLICATIONS

English translation of Chinese Patent CN 107919090 A , Author Gu JIachang , pp. 2 through 9 (Year: 2018).*

* cited by examiner

*Primary Examiner* — Thinh T Nguyen
(74) *Attorney, Agent, or Firm* — Mark M. Friedman

(57) ABSTRACT

The present invention provides a display device, including: a display region; a non-display region surrounding the display region; multiple signal lines distributed in the display region; multiple drive chips distributed in the non-display region, each of the drive chips being provided with at least one signal output end; and at least one fan-out line, one end of each fan-out line being connected to the signal output end of one of the drive chips, the other end of each fan-out line being connected to each signal line. The at least one fan-out line is entirely or partially placed over the drive chips. The invention can effectively solve the problems of low reliability of left and right bezels of the display panel and weak antistatic capability, and can make the left and right bezel narrower.

8 Claims, 11 Drawing Sheets

(51) Int. Cl.
    *H01L 23/60*        (2006.01)
    *G02F 1/1333*     (2006.01)
    *G02F 1/1362*     (2006.01)
    *H01L 29/786*    (2006.01)

(52) U.S. Cl.
    CPC .. *G02F 1/136204* (2013.01); *G02F 1/136286* (2013.01); *H01L 23/60* (2013.01); *H01L 29/78633* (2013.01); *G02F 1/133302* (2021.01)

(58) Field of Classification Search
    USPC .................. 257/72, 49, 79; 438/48, 128, 82
    See application file for complete search history.

DISPLAY DEVICE

1. FIELD OF DISCLOSURE

The present invention relates to a field of display devices and in particular, to a display device.

2. DESCRIPTION OF RELATED ART

At present, many touch screens need to have a fan-out region to arrange a data signal line extended from a display region. The fan-out region is smaller than the display region, but there are more signal lines extended at the output end in the fan-out region. As a result, in order to arrange the data signal lines extended from the display region, a wiring layout of the fan-out region should meet high requirement.

As shown in FIGS. 1 to 4, a conventional mainstream display with a touch control function has a special-shaped design to increase a ratio of the display to the entire panel. Due to the need for a stepped-shape stage-transfer circuit at a corner, a space in left and right bezels needs to be reserved between a signal output end of the stage-transfer circuit and a gate electrode line (gate line) of the display region in order to connect a metal line to the gate electrode line. This part of metal line is a fan-out line (gate fanout). The fan-out line usually occupies a portion of the space in left and right bezels of the panel, which causes a circuit at the left and right bezels to approach a cutting line, thus affecting the reliability of the display device and the antistatic capability.

SUMMARY

The present invention aims to provide a display device that can effectively solve the problem that left and right bezels of a panel have reduced reliability and weak antistatic ability, and the display device can make the left and right bezels narrower.

Accordingly, the present invention provides a display device, comprising: a display panel comprising a display region and a non-display region, the non-display region surrounding the display region; a plurality of signal lines distributed in the display region; a plurality of drive chips distributed in the non-display region, each of the drive chips being provided with at least one signal output end; and at least one fan-out line, one end of each fan-out line being connected to one of the at least one signal output end of one of the drive chips, the other end of each fan-out line being connected to each signal line, the at least one fan-out line being entirely or partially disposed over the drive chips.

According to one embodiment of the present invention, the non-display region comprises a chip region and a bending region, the bending region is connected between the chip region and the display region, the drive chips are distributed in the chip region, the signal line is extended into the bending region, and one end of each fan-out line is connected to each signal line in the bending region.

According to one embodiment of the present invention, a wiring region of the at least one fan-out line is arranged above the chip region, and each signal output end is disposed on one side of the chip region facing the wiring region.

According to one embodiment of the present invention, each signal output end is disposed on one side of each drive chip away from the bending region.

According to one embodiment of the present invention, the at least one fan-out line is arranged in a Z shape in the wiring region.

According to one embodiment of the present invention, the display device further comprises: a glass substrate; a first insulating layer disposed on the glass substrate; a second insulating layer disposed on the first insulating layer; an active layer disposed on the second insulating layer and disposed in the display region, the active layer comprising a source region and a drain region; a gate insulating layer disposed on the active layer and the second insulating layer; a gate electrode line disposed on the gate insulating layer; a third insulating layer disposed on the gate electrode line and the gate insulating layer; and a source/drain electrode line disposed on the third insulating layer, wherein the source/drain electrode line is connected to the source region and the drain region in the display region, the signal line is the source/drain electrode line, and the fan-out line is connected to the source/drain electrode line in the bending region.

According to one embodiment of the present invention, the display device further comprises: an organic layer disposed on the third insulating layer; a connection hole defined in the bending region, the connection hole penetrating through the organic layer until a surface of the source/drain electrode line; and a metal line disposed on the organic layer, the metal line being connected to the source/drain electrode line through the connection hole in the bending region; wherein the fan-out line is the metal line disposed in the bending region.

According to one embodiment of the present invention, the chip region comprises at least one corner region and a straight strip region; the drive chips are arranged in a stepped shape in the at least one corner region of the chip region; and the drive chips are sequentially arranged in the straight strip region along a longitudinal direction of the straight strip region.

According to one embodiment of the present invention, a cutting line is disposed at an edge of the non-display region, and the drive chips are disposed on one side of the chip region away from the cutting line.

Beneficial effects: The invention provides the display device. The invention includes the at least one fan-out line on the organic layer. The at least one fan-out line is entirely or partially disposed over the chip region, thereby saving a space required by most conventional products for scan lines from the chip region to the display region. Therefore, the chip region is away from the cutting line, thus improving electrostatic discharge (ESD) protection capability and reliability (RA) of the left and right narrow bezels, and can make the left and right bezels narrower.

BRIEF DESCRIPTION OF DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without an inventive work or paying the premise.

DETAILED DESCRIPTION OF EMBODIMENTS

Figure 1:
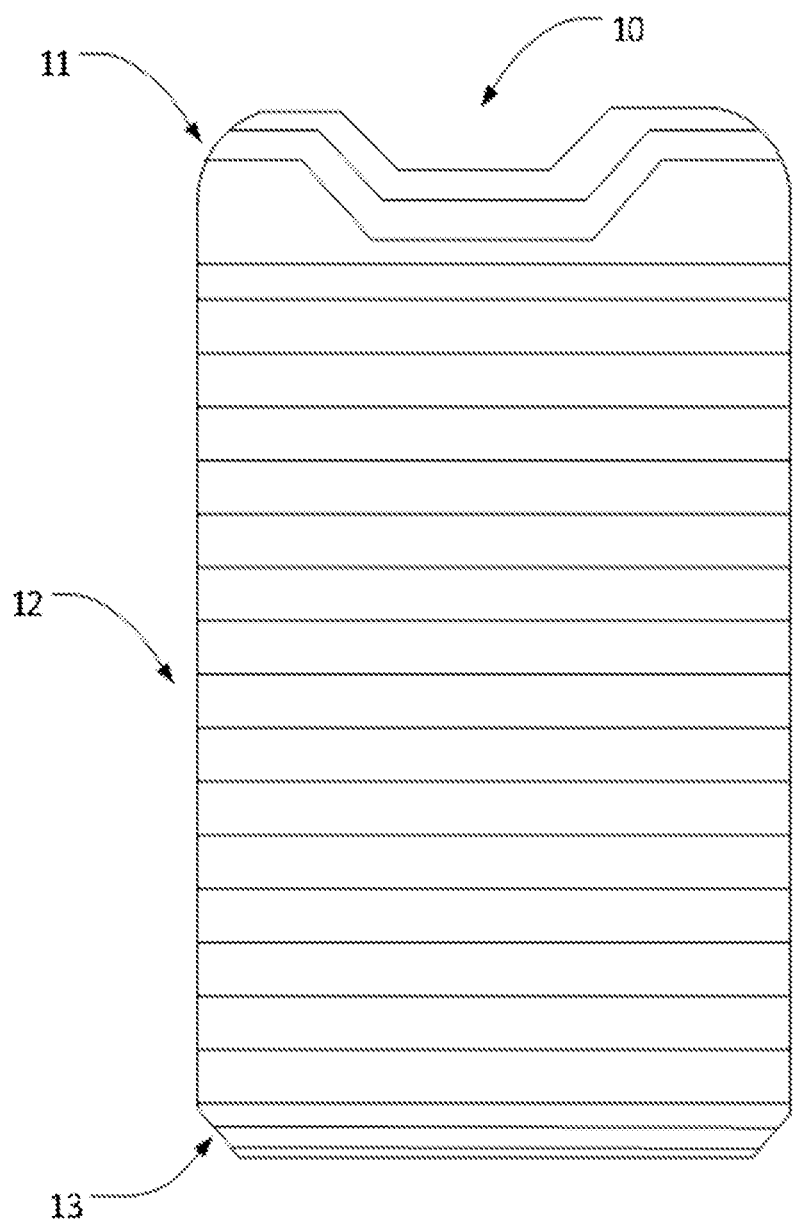
FIG. 1 is a schematic structural view illustrating a conventional display device.
Figure 2:
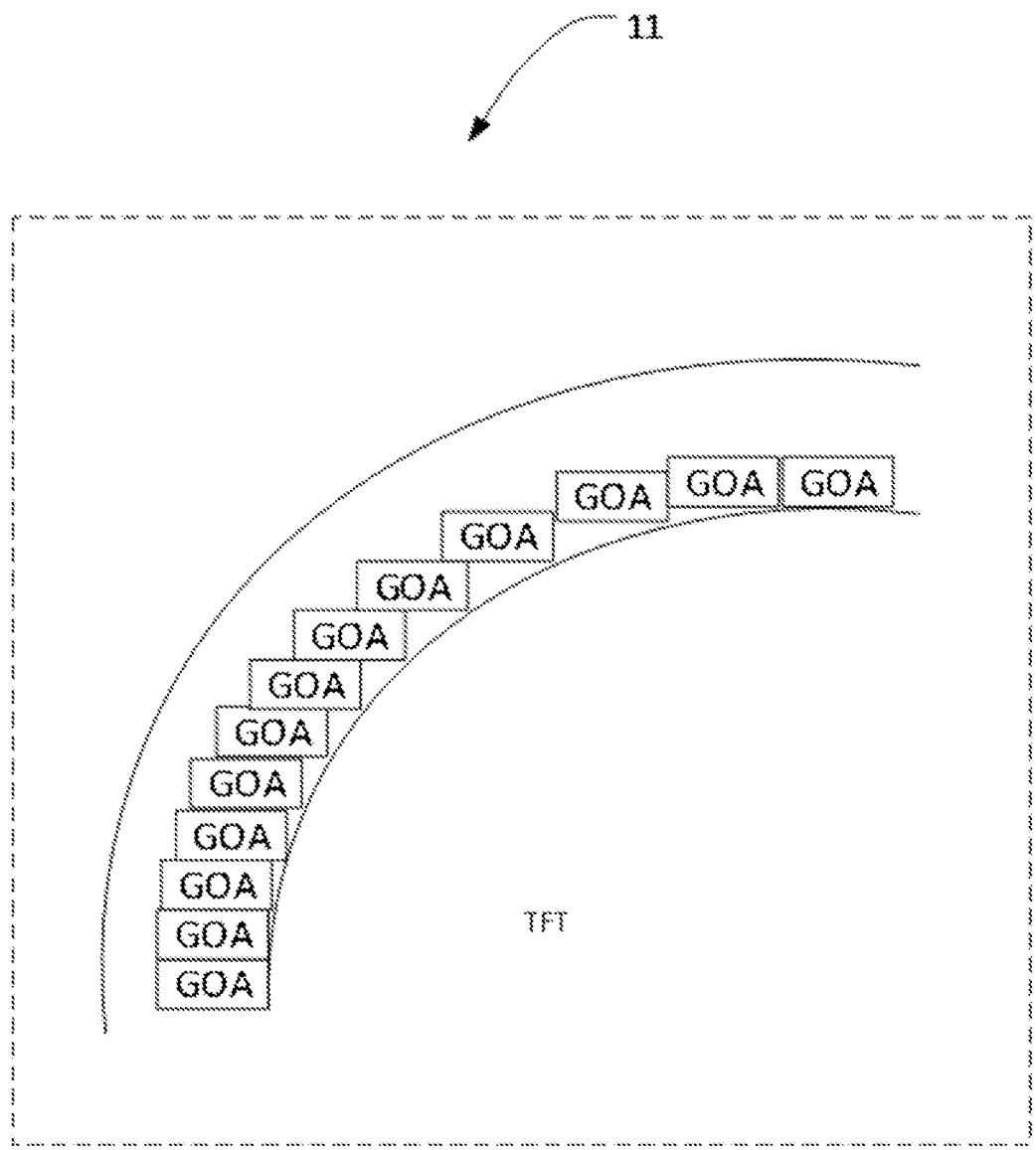
FIG. 2 is a schematic enlarged view illustrating a layout of drive chips at a corner of a prior art 11.
Figure 3:
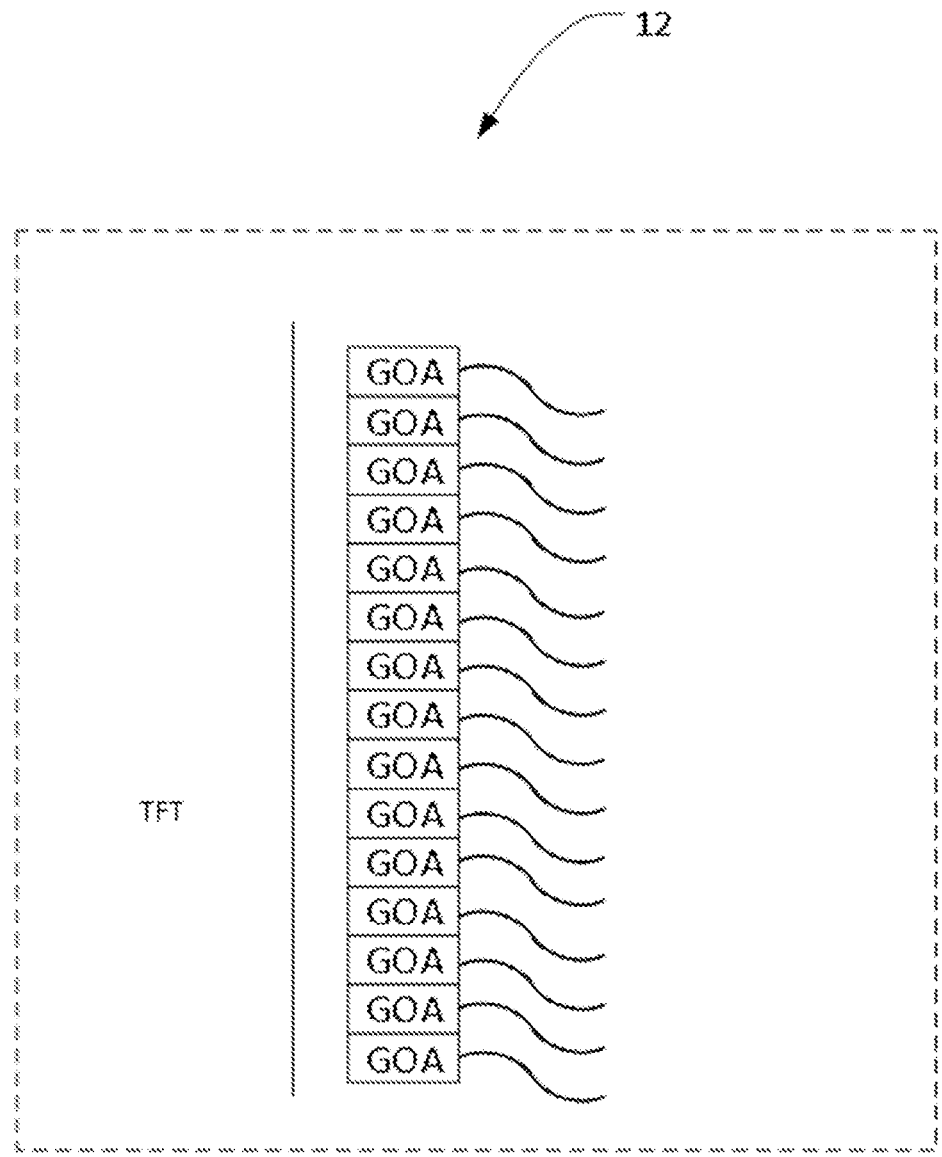
FIG. 3 is a schematic enlarged view illustrating a layout of drive chips at a bezel of a prior art 12.
Figure 4:
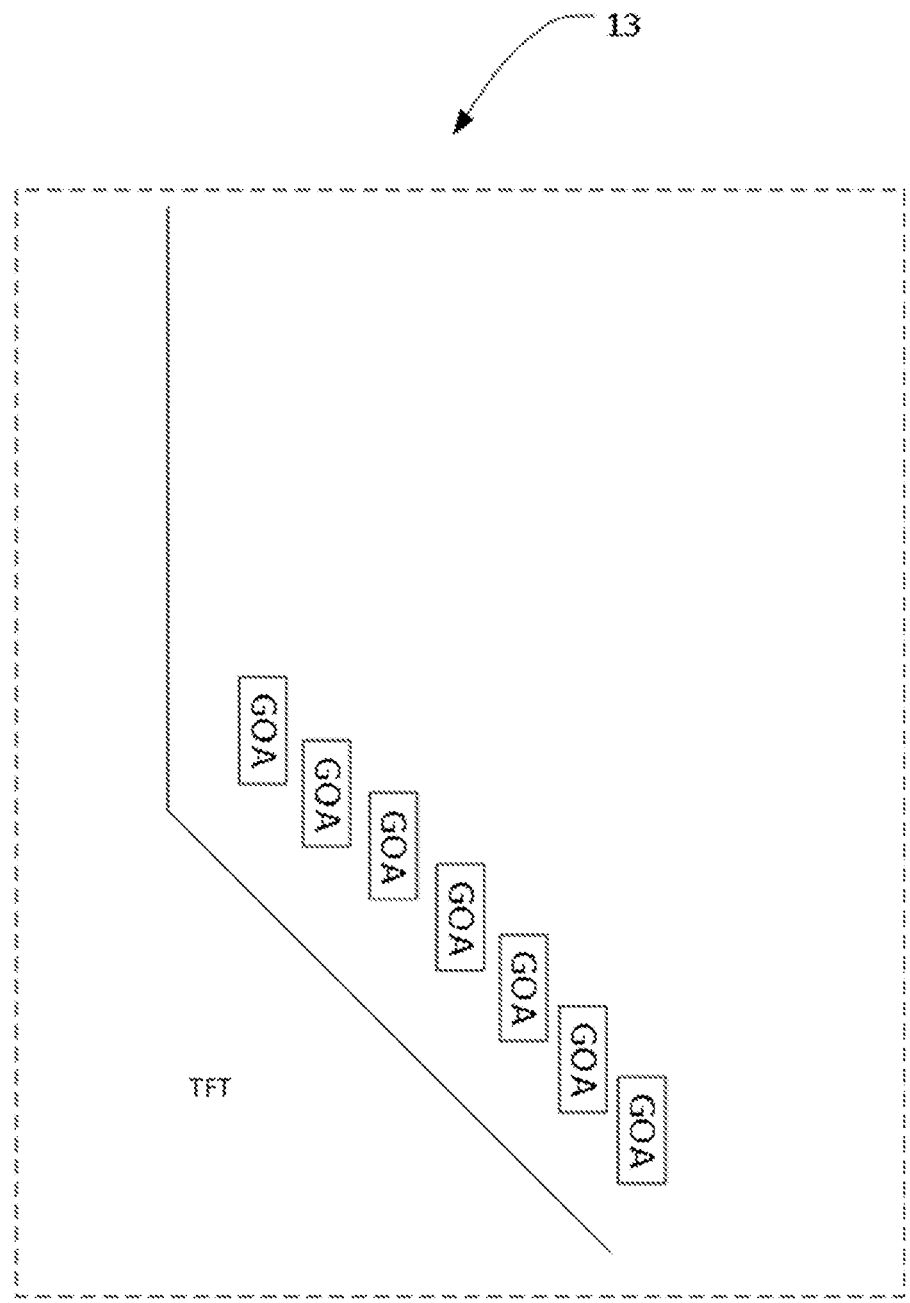
FIG. 4 is a schematic enlarged view illustrating a layout of drive chips at a corner of a prior art 13.
Figure 5:
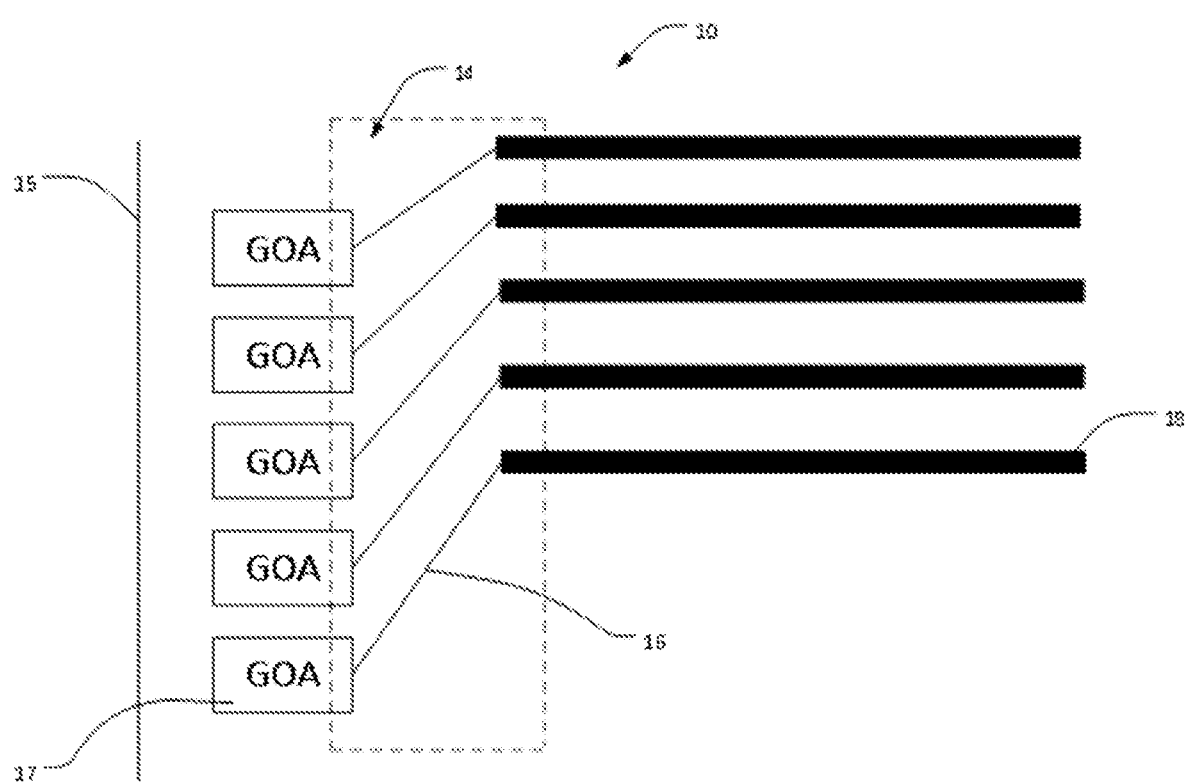
FIG. 5 is a schematic enlarged view illustrating a wiring layout of a fan-out region of a prior art.

The embodiments of the present invention are described in detail below, and the examples of the embodiments are illustrated in the accompanying drawings, wherein the same or similar reference numerals indicate the same or similar elements or elements having the same or similar functions. The embodiments described below with reference to the accompanying drawings are intended to be illustrative of the invention and are not to be construed as limiting.

In the description of the present invention, it is to be understood that the terms indicating directions or position relationship such as "center", "longitudinal", "transverse", "length", "width", "thickness", "upper", "lower", "front", "rear", "left", "right", "vertical", "horizontal", "top", "bottom", "inside", "outside", "clockwise", "counterclockwise", and etc. are used for the purpose of enhancing a reader's understanding about the accompanying drawings and also simplifying description, but are not intended to be limiting. Moreover, the terms "first" and "second" are used for descriptive purposes only and are not to be construed as indicating or implying a relative importance or implicitly indicating the number of technical elements referred to. Thus, an element defined by "first" or "second" may include one or more of the described element either explicitly or implicitly. In the description of the present invention, the meaning of "multiple" is two or more unless otherwise specifically defined.

In the description of the present invention, it should be noted that the terms "installation", "connected", and "coupled" are to be construed in a broad sense, unless otherwise specifically defined. For example, these terms may indicate fixed connection, detachable connection, or being integrally connected; in some cases, these terms may indicate being mechanically connected, electrically connected or being able to communicate with each other; in other cases, these terms indicate being directly connected, or being indirectly connected through an intermediate medium, or inner spaces of two elements communicate with each other, or interaction relationship between two elements. For those skilled in the art, the specific meanings of the above terms in the present invention can be understood on a case-by-case basis.

In the present invention, unless otherwise specifically defined and defined, the first element "on" or "under" the second element means that the first element directly contacts the second element or means that the first element does not directly contact the second element but contacts the second element through other element. Moreover, the first element "above" and "over" the second element means that the first element is right above or obliquely above the second element, or merely indicates that the first element is located at a higher level than the second element. The first element "below" and "under" the second element indicates that the first element is right under or obliquely below the second element, or merely indicates that the first element is located at a lower level than the second element.

The following disclosure provides many different embodiments or examples for implementing different structures of the present invention. In order to simplify the disclosure of the present invention, components and configurations of the specific examples are described below. Certainly, the descriptions are for exemplifying purposes and are not intended to limit the invention. In addition, reference numerals and/or reference letters can be repeated in various examples of the present invention for simplicity and clarity, and do not indicate the relationship between the various embodiments and/or configurations. Moreover, although the present invention provides examples of various specific processes and materials, it should be noted that one of ordinary skill in the art will realize other processes and/or the use of other materials based on the present invention.

Figure 6:
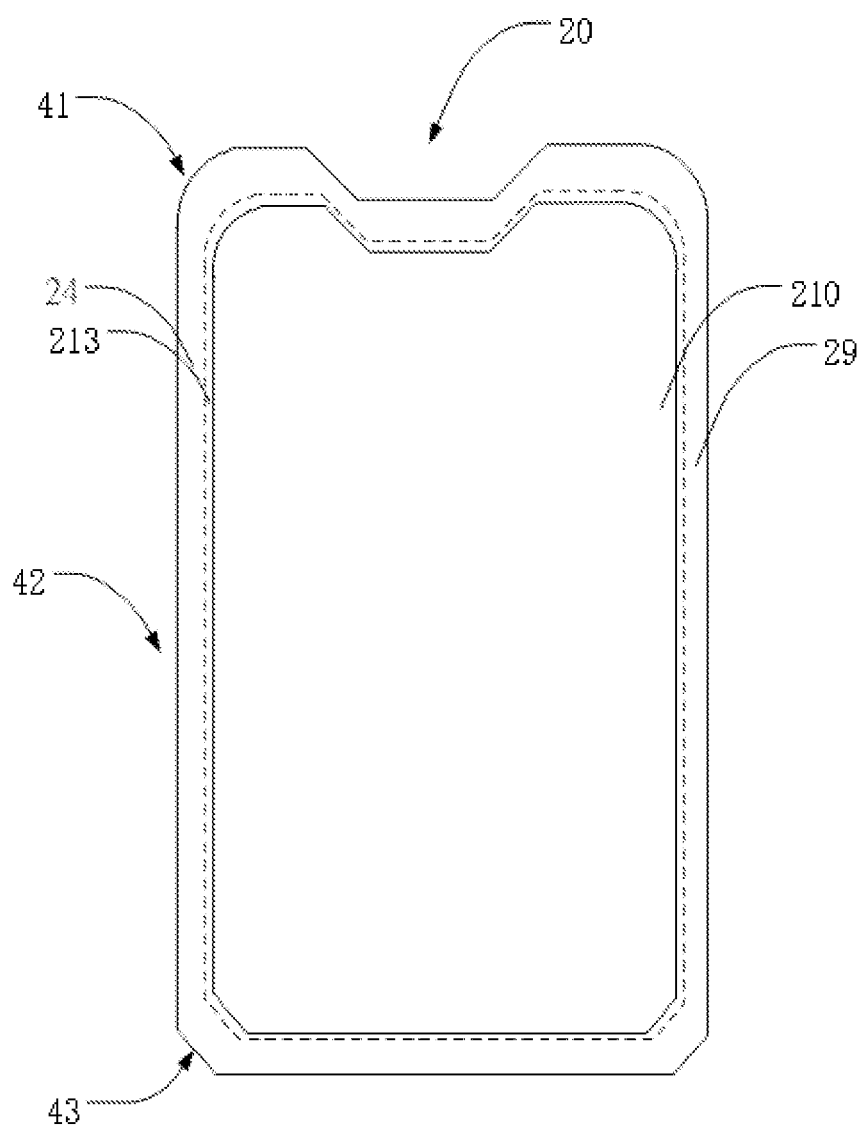
FIG. 6 is a schematic structural view illustrating a display device according to the present invention.

As shown in FIG. 6, according to one embodiment of the present invention, the display device comprises a display panel 20, a plurality of drive chips 27, and at least one fan-out line 26. The drive chips 27 are preferably gate on array (GOA) drive chips 27 (labelled as "GOA" in FIGS. 7 and 9-12). Each of the GOA drive chips 27 generates a scan driving signal and is configured to transmit the scan driving signal to a corresponding signal line 28.

The display panel 20 comprises a display region 210 and a non-display region 29. The non-display region 29 surrounds the display region 210. The non-display region 29 comprises a chip region 24 and a bending region 213. The bending region 213 is connected between the chip region 24 and the display region 210.

Figure 11:
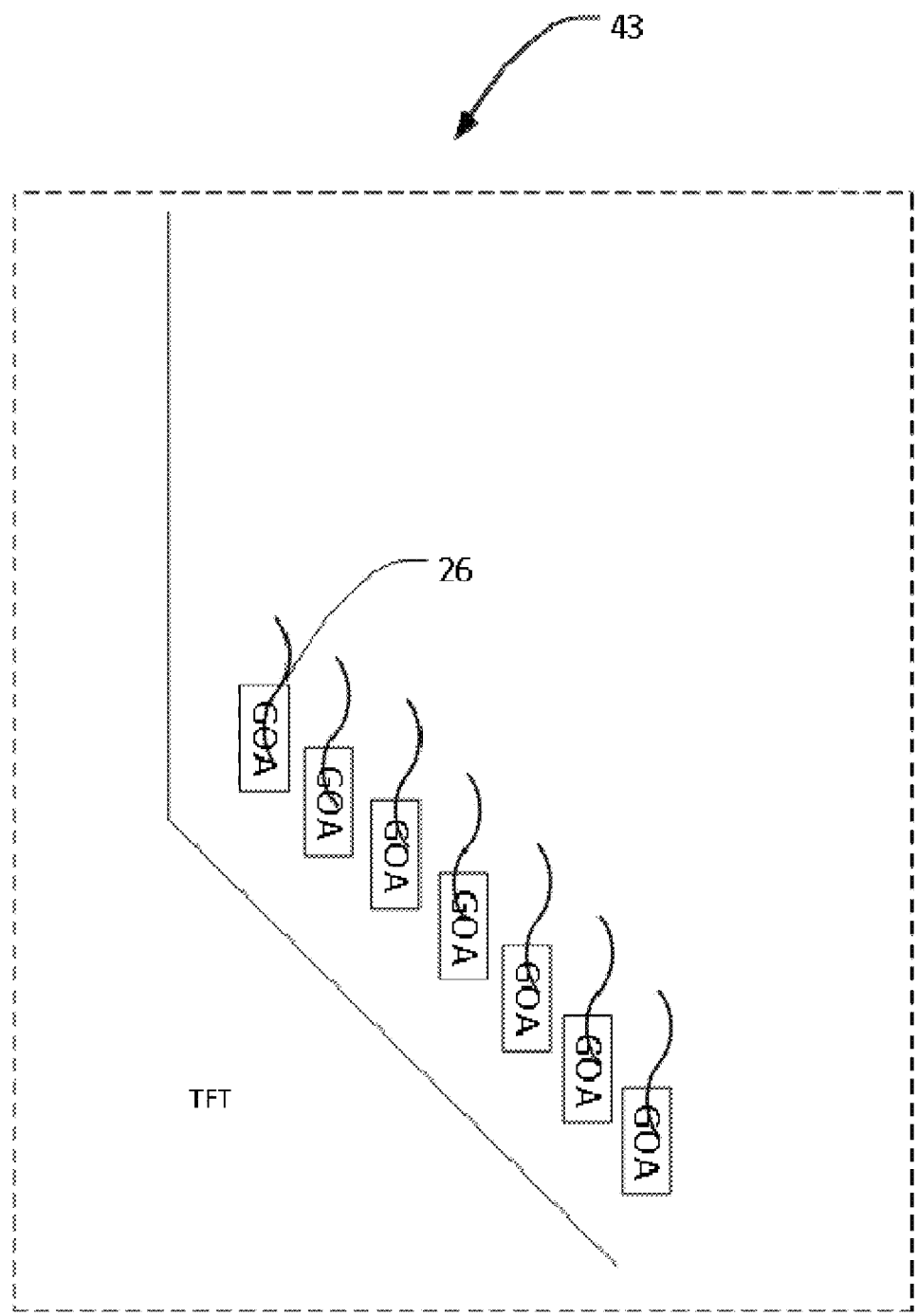
FIG. 11 is a schematic enlarged configuration view illustrating the drive chips at a corner 43 of the display device according to the present invention.
Figure 12:
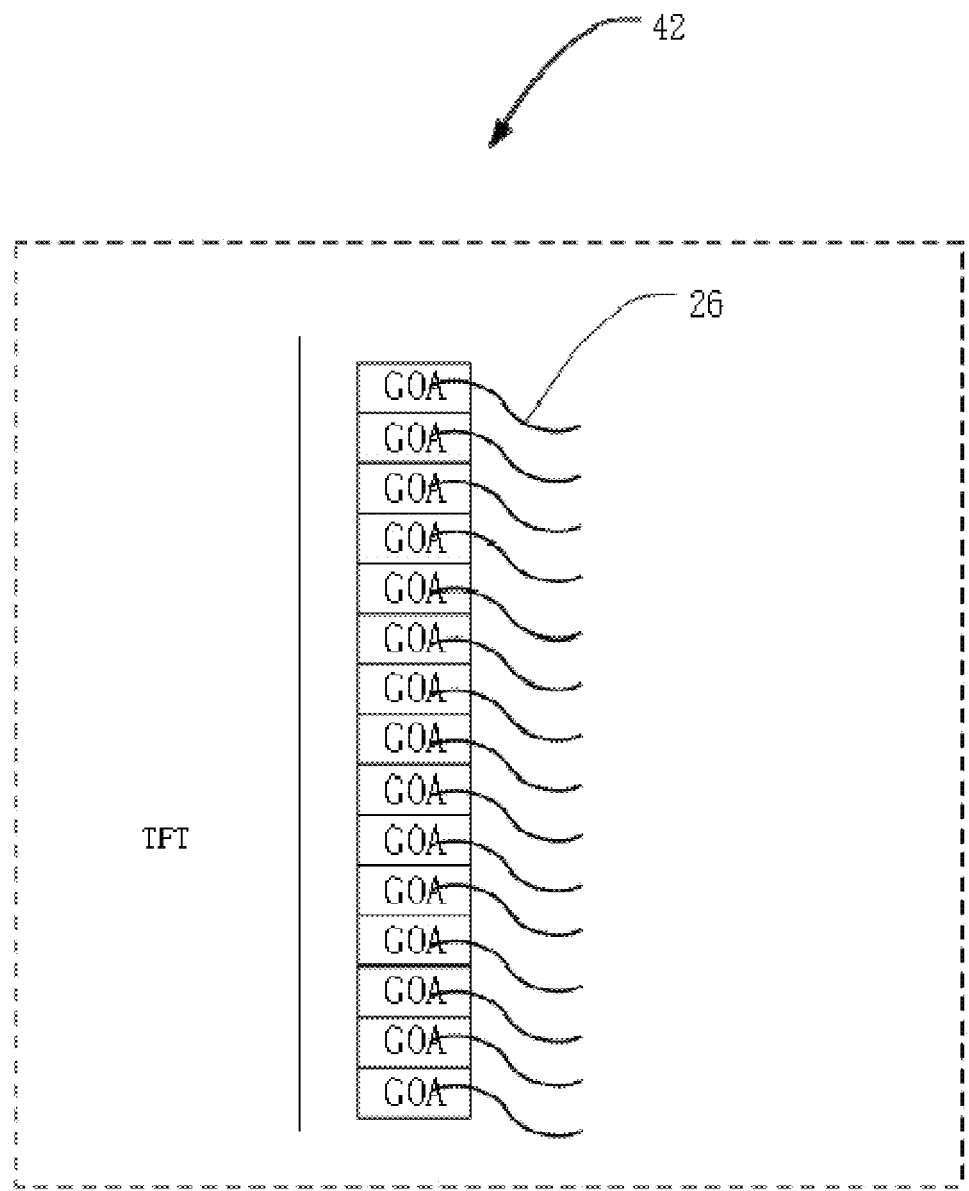
FIG. 12 is a schematic enlarged configuration view illustrating the drive chips at a bezel 42 of the display panel according to the present invention.

The drive chips 27 are distributed in the chip region 24 of the non-display region 29. In the present embodiment, the display region 29 is of a rectangular shape, a square shape, or the like and has a certain number of corners (typically including four corners). Accordingly, the chip region 24 includes at least one corner region 41 and a straight strip region 42 (also called a bezel region). Referring to FIGS. 11 and 12, the drive chips are arranged in a stepped shape in the corner region of the chip region 24. In the straight strip region 42, the drive chips are sequentially arranged along a longitudinal direction of the straight strip region.

Figure 7:
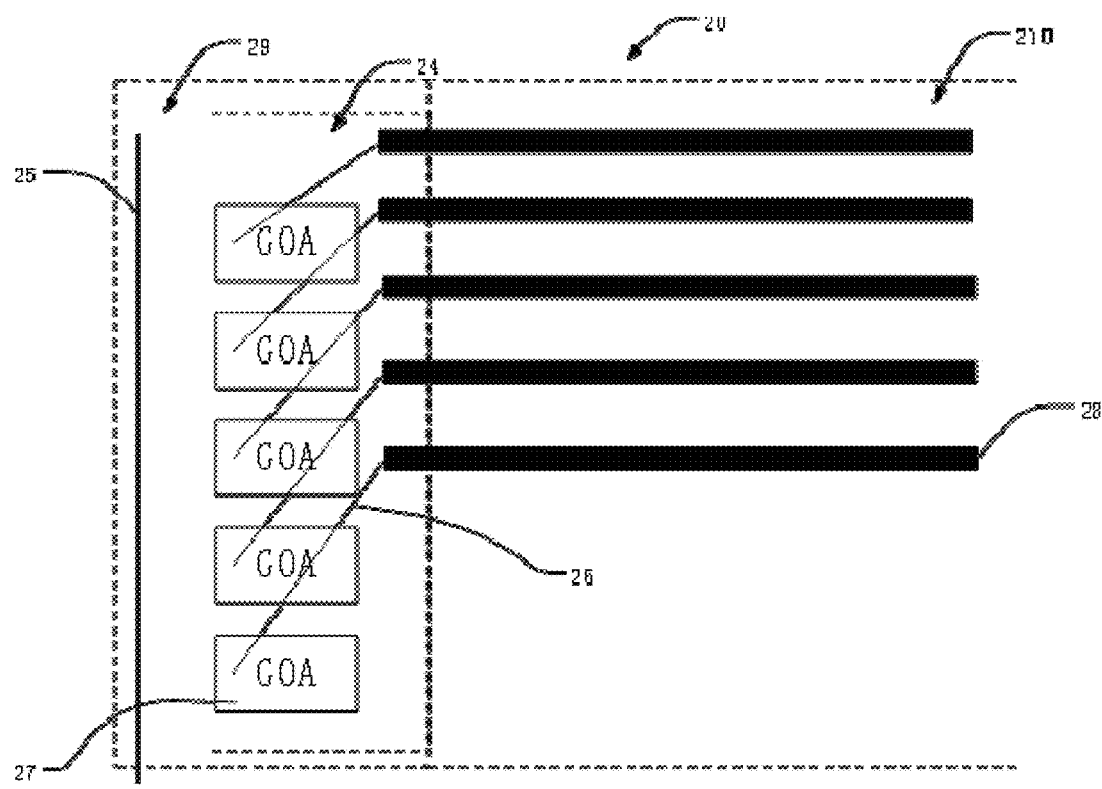
FIG. 7 is a schematic view illustrating a wiring layout of a fan-out region of the display device according to the present invention.

As shown in FIG. 7, the display panel comprises a plurality of signal lines 28. The signal lines 28 are distributed in the display region 210 and extended to the bending region 213. The signal lines 28 in the bending region 213 are used to connect the drive chips 27.

In order to reduce a space required for arranging the at least one fan-out line 26, the at least one fan-out line 26 is extended from the bending region 213 of the display device, and the at least one fan-out line 26 extended out is entirely or partially placed over the drive chips 27 and connected to the drive chips 27.

Figure 8:
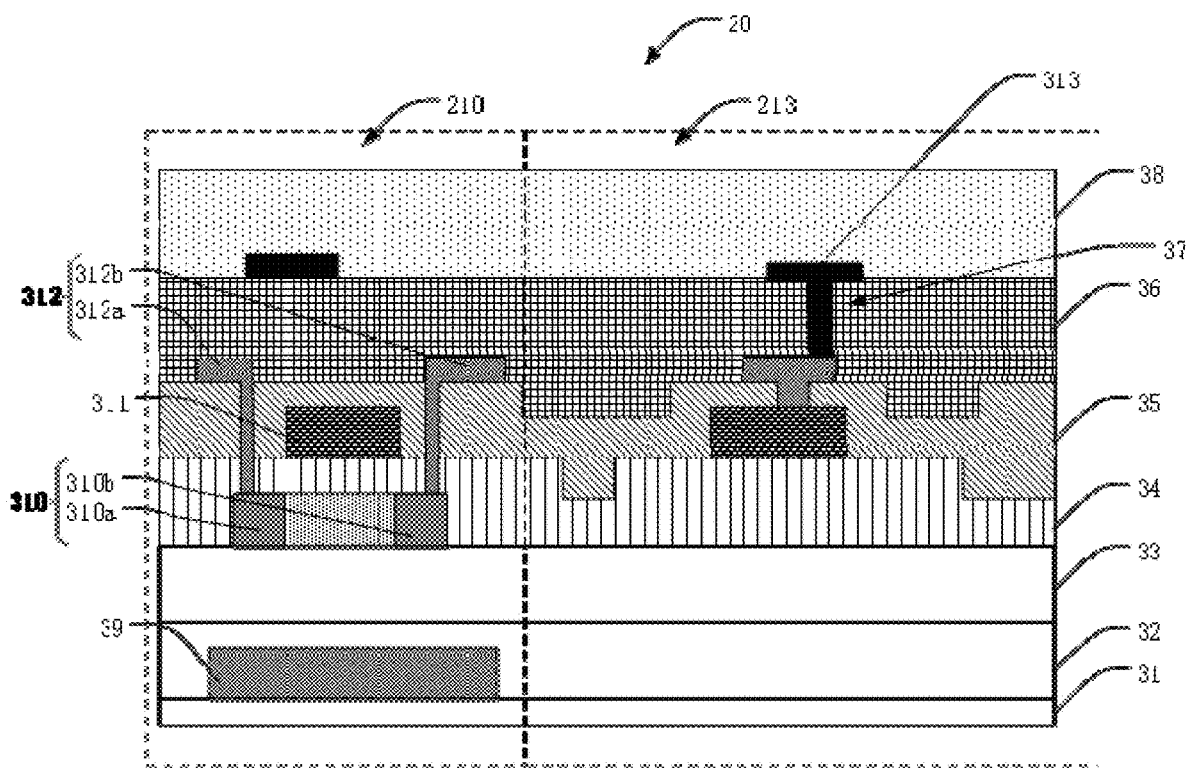
FIG. 8 is a cross-sectional structural view illustrating the display device according to the present invention.

In the present embodiment, the at least one fan-out line 26 is at least one internal line in the display device. As shown in FIG. 8, the display device comprises: a glass substrate 31; a light shielding layer 39; a first insulating layer 32; a second insulating layer 33; an active layer 310; a gate insulating layer 34; a third insulating layer 35; a gate electrode line 311; a source/drain electrode line 312; and an organic layer 36. The light shielding layer 39 is disposed on the glass substrate 31. The first insulating layer 32 is disposed on the light shielding layer 39 and the glass substrate 31. The second insulating layer 33 is disposed on the first insulating layer 32. The active layer 310 is disposed on the second insulating layer 33, arranged in the display region 210, and disposed corresponding to the light shielding layer 39. The active layer 310 includes a source region 310a and a drain region 310b. The gate insulating layer 34 is disposed on the active layer 310 and the second insulating layer 33. The gate electrode line 311 is disposed on the gate insulating layer 34. The third insulating layer 35 is disposed on the gate electrode line 311 and the gate insulating layer 34. The source/drain electrode line 312 is disposed on the third insulating layer 35. In the display region 210, the source/drain electrode line 312 is connected to the source region 310a and the drain region 310b. In the present embodiment, the source/drain electrode line 312 serves as the signal line 28 connected to the fan-out line 26. In practice, after the organic layer 36 is disposed on the third insulating layer 35, a connection hole 37 is defined. The connection hole 37 is defined in the bending region 213 and penetrates through the organic layer 36 until a surface of the source/drain electrode line 312. After that, a metal line 313 is deposited on the organic layer 36. In the bending region 213, the metal line 313 is connected to the source/drain electrode line 312 through the connection hole 37. Then, the fourth insulating layer 38 is disposed on upper surfaces of the organic layer 36 and the metal line 313. In the present embodiment, the fan-out line is the metal line 313 disposed inside the display device and extended to over the drive chips.

In the present embodiment, the fan-out line 26 is the metal line 313 in the bending region 213. The at least one fan-out line 26 is arranged in the bending region 213. The bezel region 42 and the corners 41, 43 adopt a wiring layout of the fan-out region of the present invention, so a distance from the drive chips to a cutting line is reduced, a space required for the at least one fan-out line is thereby reduced, and reliability (RA) and electrostatic discharge (ESD) protection capability of the display device are also improved.

In the display device of the present embodiment, the signal lines 28 connected to the at least one fan-out line 26 of the bending region 213 are parallel to each other. The signal line 28 is a source electrode line 312a or a drain electrode line 312b in the bending region 213 of the display device. The source/drain electrode line 312 electrically connected to the gate electrode line 311 serves as the signal line 28 of the display region 210. In alternative embodiments, the source/drain electrode line 312 is used alone as the signal line 28 of the display region 210, or the gate electrode line 311 may be used alone as the signal line 28 of the display region 210, which doesn't compromise the innovation of the present invention. In addition, the source/drain electrode line in the display region is used to drive a display function of the display region.

The source electrode lines in the bending region 210 of the display device are parallel to each other and are the signal lines 28 of the display region 210 of the present invention. The signal line 28 includes a plurality of data lines and a plurality of scan lines, and the data lines are parallel to each other. The scan lines are perpendicular to the data lines and are parallel to each other, and the data lines and the scan lines are interlaced to form a mesh structure. The drive chip 27 is connected to the source/drain electrode line 312 of the bending region 213 through the metal line 313. The data line in the display region is connected to the drain electrode line 312b of the bending region, and the scan line of the display region is connected to the gate electrode line 311 of the bending region. The source electrode line 312a of the display region is connected to a pixel electrode, and is mainly used for driving the display function of liquid crystals of the display screen, so that the display region can display images normally.

The non-display region 210 includes a chip region 24 and a bending region 213 connected between the chip region 24 and the display region 210. The drive chips 27 are distributed in the chip region 24. The signal lines 28 are extended to the bending region 213, one end of each fan-out line 26 is connected to each signal line 28 of the bending region 213. This way, a signal of the drive chip 27 can be transmitted to the display region 210, and the display region 210 can display images normally.

Figure 9:
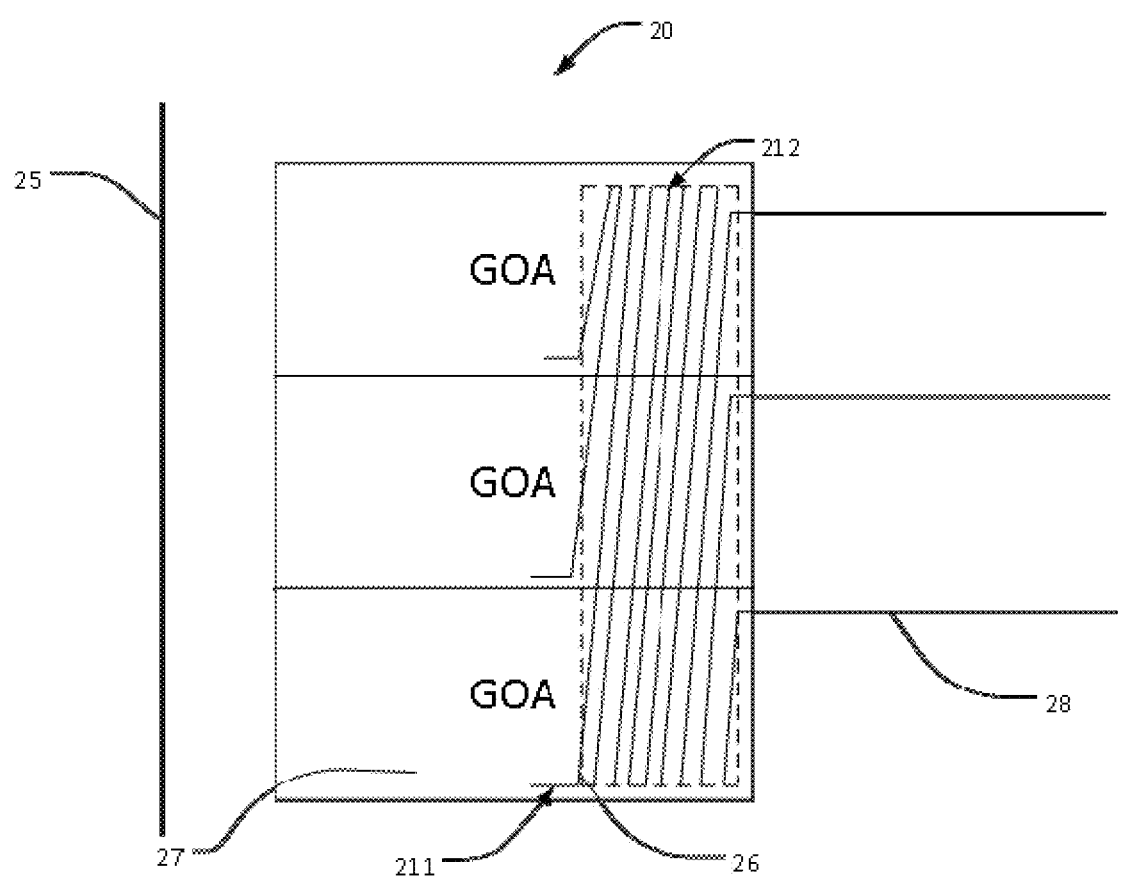
FIG. 9 is a schematic view illustrating a Z-shaped wiring layout in the fan-out region of the display device according to the present invention.

As shown in FIG. 9, the drive chip 27 is provided with at least one signal output end 211 for connecting the fan-out line 26, and transmitting the signal of the drive chip 27 to the signal line 28 of the display region 210 through the fan-out line 26. One end of each fan-out line 26 is connected to one of the at least one signal output end of one of the drive chips 27, and the other end of each fan-out line 26 is connected to each signal line 28. The at least one fan-out line 26 is partially or entirely disposed over the drive chips 27. This can reduce a space for arranging the at least one fan-out line 26, so the drive chips 27 can be disposed away from the cutting line 25, thus further improving the reliability (RA) and electrostatic discharge (ESD) protection capability of the display device, and reducing the difficulty of the manufacturing process.

A wiring region 212 of the at least one fan-out line 26 is arranged above the chip region 24, and each signal output end 211 is disposed on one side of the chip region 24 facing the wiring region 212. Each signal output end 211 is disposed on one side of each drive chip 27 away from the bending region 213. The fan-out line 26 is arranged in a Z shape in the wiring region 212. By the Z shaped configuration, a length of the fan-out line 26 increases, which is advantageous for increasing the impedance of the fan-out line 26.

Figure 10:
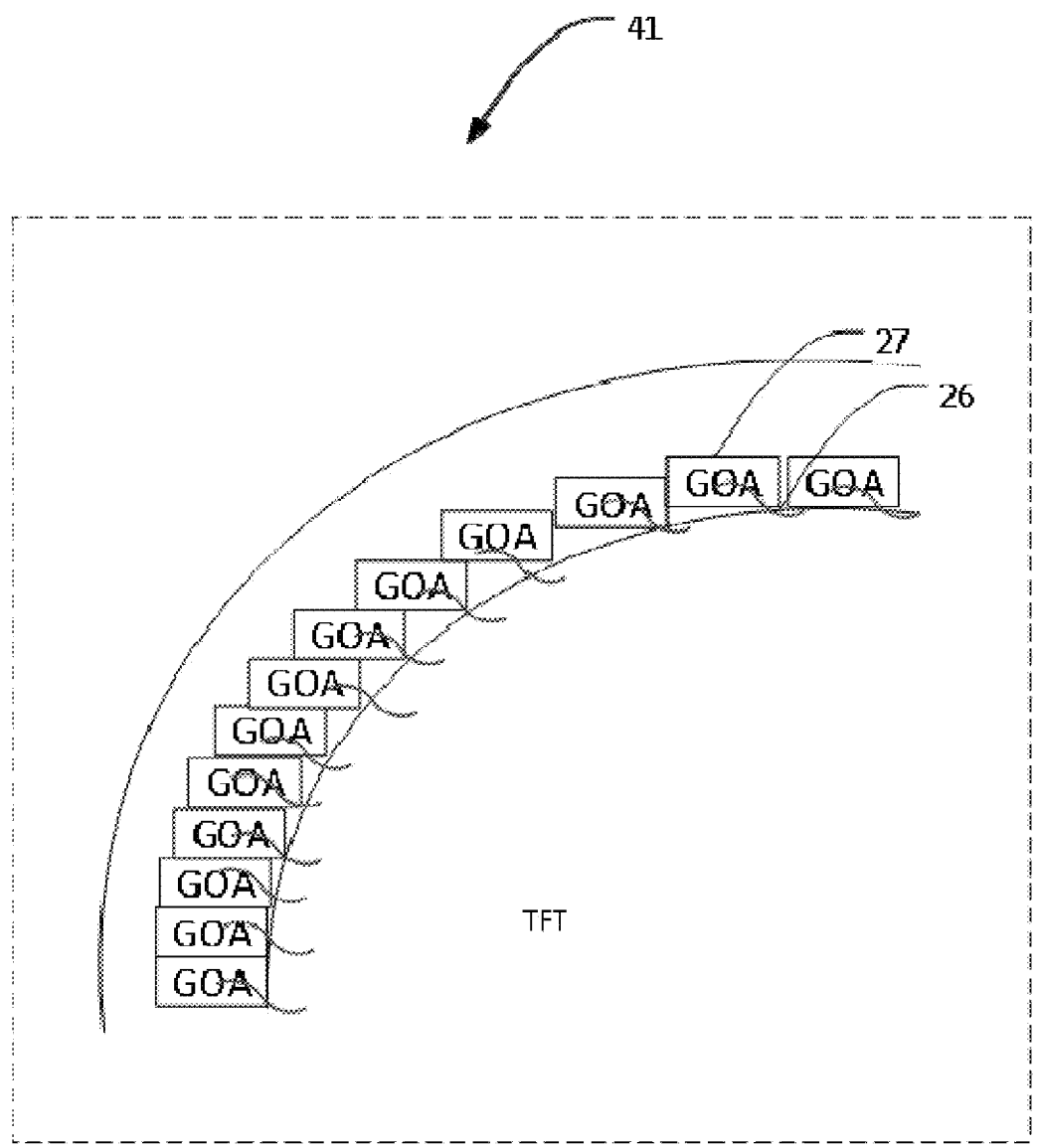
FIG. 10 is a schematic enlarged configuration view illustrating drive chips at a corner 41 of the display device according to the present invention.

As shown in FIGS. 10 and 11, the cutting line is at an edge of the non-display region. In the chip region, the drive chip is located on a side away from the cutting line. Since many screens are now irregular screens with a unique shape structure, generally there are a plurality of corners. The corners 41 and 42 use the wiring layout of the fan-out region of the present invention, the drive chips 27 are arranged in a stepped shape at the corner 41, and the at least one fan-out line 26 is partially or entirely arranged on the drive chips 27, so a width of a bezel is effectively reduced, the drive chips 27 can be disposed away from the cutting line 25, and the RA and ESD protection capability of the display device can be improved.

As shown in FIG. 12, the bezel region 42 uses the wiring layout of the fan-out region of the present invention, and the drive chip 27 is linearly distributed on the corner 41, so that the at least one fan-out line 26 is partially or entirely disposed on the drive chips 27. As a result, the width of the bezel is effectively reduced, the drive chips 27 can be disposed away from the cutting line 25, and the RA and ESD protection ability of the display device are also improved.

The display device of the present invention certainly can include other structures such as a package frame. The main design point of the present invention is in the spatial arrangement of the at least one fan-out line. In detail, in the display device in the present embodiment, the at least one fan-out line 26 is partially or entirely arranged above the drive chips 27. By using the wiring layout of the fan-out region at the bezel region 42 and the corners 41 and 43, the width of the bezel can be effectively reduced, the at least one fan-out line takes up a smaller space, the drive chips 27 can be disposed away from the cutting line 25, and the RA and ESD protection capability of the display device are thereby improved.

The display device of the embodiments of the present invention is described in detail above. The principles and embodiments of the present invention are described in the specific examples. The description of the above embodiments is only provided for a better understanding of the present invention and is not intended to limit the scope of the present invention. Equivalent changes and modifications made in the spirit of the present invention are regarded as falling within the scope of the present invention.

What is claimed is:

1. A display device, comprising:
    a display panel comprising a display region and a non-display region, the non-display region surrounding the display region, wherein the non-display region comprises a chip region and a bending region, the bending region is connected between the chip region and the display region;
    a plurality of signal lines, the signal lines being distributed in the display region and extended into the bending region;
    a plurality of drive chips, the drive chips being distributed in the non-display region, each of the drive chips being provided with at least one signal output end;
    a plurality of fan-out lines, one end of each of the fan-out lines connected to one of the at least one signal output end of one of the drive chips, the other end of each of the fan-out lines connected to a corresponding one of the signal lines in the bending region, the fan-out lines entirely or partially disposed over the drive chips; and
    a substrate, a first insulating layer, a second insulating layer, an active layer, a gate insulating layer, a gate electrode line, a third insulating layer, a source/drain electrode line, an organic layer, and a metal line stacked in sequence;
    wherein the active layer comprises a source region and a drain region, and the source/drain electrode line is connected to the source region and the drain region in the display region, wherein the signal line is the source/drain electrode line, the fan-out line is connected to the source/drain electrode line of the bending region, a connection hole is defined in the bending region and penetrates through the organic layer until a surface of the source/drain electrode line, and the metal line is connected to the source/drain electrode line through the connection hole in the bending region.

2. The display device according to claim 1, wherein a wiring region of the each of the fan-out lines is arranged above the chip region, and each of the signal output ends is disposed on one side of the chip region facing the wiring region.

3. The display device according to claim 2, wherein each of the signal output ends is disposed on one side of a corresponding one of the drive chips away from the bending region.

4. The display device according to claim 2, wherein the each of the fan-out lines is arranged in a Z shape in the wiring region.

5. The display device according to claim 1, wherein the chip region comprises at least one corner region and a straight strip region, the drive chips are arranged in a stepped shape in the at least one corner region of the chip region, and the drive chips are sequentially arranged in the straight strip region along a longitudinal direction of the straight strip region.

6. The display device according to claim 5, wherein the signal lines connected to the fan-out lines are parallel to each other.

7. The display device according to claim 1, wherein a cutting line is disposed at an edge of the non-display region, and the drive chips are disposed on one side of the chip region away from the cutting line.

8. The display device according to claim 1, wherein each of the fan-out lines is the metal line disposed inside the display panel and extends to over the drive chips.

* * * * *